United States Patent
Potemski et al.

(10) Patent No.: US 8,413,103 B2
(45) Date of Patent: Apr. 2, 2013

(54) EXECUTION MONITOR FOR ELECTRONIC DESIGN AUTOMATION

(75) Inventors: Andrew Stanley Potemski, Round Rock, TX (US); John Scott Tyson, Austin, TX (US); Steven Robert Eustes, Fort Worth, TX (US)

(73) Assignee: Synopsys, Inc., Mountain View, CA (US)

( * ) Notice: Subject to any disclaimer, the term of this patent is extended or adjusted under 35 U.S.C. 154(b) by 280 days.

(21) Appl. No.: 12/423,955

(22) Filed: Apr. 15, 2009

(65) Prior Publication Data

US 2010/0235795 A1     Sep. 16, 2010

Related U.S. Application Data

(60) Provisional application No. 61/160,202, filed on Mar. 13, 2009.

(51) Int. Cl.
*G06F 15/04* (2006.01)
*G06F 17/50* (2006.01)

(52) U.S. Cl. ........ 716/139; 716/100; 716/101; 716/102; 716/106; 716/111; 703/22

(58) Field of Classification Search .................. 716/139, 716/100, 101, 102, 106–113, 134; 703/22
See application file for complete search history.

(56) References Cited

U.S. PATENT DOCUMENTS

| | | | |
|---|---|---|---|
| 5,673,404 A * | 9/1997 | Cousins et al. ............... | 715/809 |
| 5,940,604 A * | 8/1999 | Merryman et al. ........... | 716/132 |
| 6,173,246 B1 * | 1/2001 | Billups, III .................... | 703/22 |
| 6,587,995 B1 | 7/2003 | Duboc | |
| 6,851,107 B1 * | 2/2005 | Coad et al. .................... | 717/108 |
| 7,076,740 B2 * | 7/2006 | Santori et al. ................. | 715/771 |
| 7,076,751 B1 | 7/2006 | Nixon | |
| 7,110,936 B2 * | 9/2006 | Hiew et al. ..................... | 703/22 |
| 7,496,864 B2 * | 2/2009 | Burnette et al. .............. | 716/132 |
| 7,523,441 B2 * | 4/2009 | Petersen et al. ............... | 717/113 |
| 7,640,527 B1 * | 12/2009 | Dorairaj et al. ............... | 716/139 |
| 7,840,913 B1 * | 11/2010 | Agrawal et al. ................ | 703/22 |
| 2003/0061600 A1 * | 3/2003 | Bates et al. .................... | 717/133 |
| 2005/0010890 A1 | 1/2005 | Nehmadi | |
| 2006/0161452 A1 | 7/2006 | Hess | |
| 2008/0034300 A1 * | 2/2008 | Shah et al. ..................... | 715/763 |
| 2008/0229262 A1 * | 9/2008 | Harashima et al. ............... | 716/5 |

* cited by examiner

*Primary Examiner* — Thuan Do
(74) *Attorney, Agent, or Firm* — Park, Vaughan, Fleming & Dowler LLP; Laxman Sahasrabuddhe

(57) ABSTRACT

Embodiments of a computer system, a method, a graphical user interface and a computer-program product (i.e., software) for use with the computer system are described. A chip designer may use these devices and techniques to configure and monitor the execution of tasks in a user-configurable electronic-design-automation (EDA) flow associated with a circuit or chip design. In particular, using an intuitive and interactive graphical user interface in EDA software, the chip designer can configure and initiate execution of the EDA flow. Then, during execution of EDA tasks in the EDA flow, an execution monitor in the graphical user interface may provide a graphical representation of real-time execution status information for the EDA tasks. Moreover, using the EDA software, the chip designer can debug the circuit or chip design if any errors or problems occur.

23 Claims, 8 Drawing Sheets

EXECUTION MONITOR FOR ELECTRONIC DESIGN AUTOMATION

RELATED APPLICATION

This application claims the benefit of U.S. Provisional Application No. 61/160,202, entitled "Execution Monitor for Electronic Design Automation," by inventors Andrew Stanley Potemski, John Scott Tyson, and Steven Robert Eustes, filed on 13 Mar. 2009.

BACKGROUND

1. Field

The present disclosure relates to electronic-design-automation (EDA) techniques. More specifically, the present disclosure relates to a technique for monitoring the execution of EDA software.

2. Related Art

As semiconductor technology is scaled to ever smaller dimensions, there are commensurate increases in chip complexity. For example, smaller dimensions typically result in chips with an increased number of logic gates and time domains. Moreover, this increase in chip complexity typically results in a significant increase in the time and cost needed to design chips.

In an attempt to address these problems, chip designers are using more sophisticated design techniques. However, the complexity of the resulting EDA software often restricts project visibility, which makes it difficult for chip designers to monitor and manage the large number of design details, including complicated foundry-specific design rules and libraries. As a consequence, chip-design productivity and schedule predictability are often adversely affected. Indeed, the majority of chip-design tape-outs fail to meet their deadlines.

Hence, there is a need for an EDA technique without the above-described problems.

SUMMARY

One embodiment of this disclosure provides a computer system to monitor execution of a user-configurable EDA flow. During operation, the computer system provides first signals to display a flow-control environment on a display, where the flow-control environment includes an execution-monitoring window. Moreover, the computer system receives a first user input to initiate the user-configurable EDA flow, which is represented as a sequence of blocks, and the computer system monitors execution of the user-configurable EDA flow. Then, the computer system provides second signals to display execution status information in the execution-monitoring window of progress during execution of the user-configurable EDA flow and errors, if any, which occur.

In some embodiments, the computer system receives a second user input to debug an error which occurred. This error may be debugged during execution of the user-configurable EDA flow.

A given block in the sequence of blocks may include a sub-block flow, and a given sub-block in the sub-block flow may represent a sequence of EDA tasks that are performed on a circuit design. Furthermore, execution of the user-configurable EDA flow may include monitoring the execution of the sequence of EDA tasks, and the execution status information may include execution status of the sequence of EDA tasks. Consequently, the execution status information may include color-coded information for the sequence of EDA tasks. Note that at least some of the sequence of EDA tasks and/or portions of the sequence of blocks may be predefined.

In some embodiments, the computer system provides third signals to display a graphical representation of the sequence of blocks in the flow-control environment. This sequence of blocks may be defined by a user using drag-and-drop assembly of blocks. Moreover, the graphical representation of the sequence of blocks may be presented in a what-you-see-is-what-you-get format. In this graphical representation, arrow icons may indicate sources and destinations of information during the user-configurable EDA flow. Additionally, progress and any errors during execution of the user-configurable EDA flow may be indicated in the graphical representation using color-coded information.

Note that the sequence of blocks may include blocks that are executed in parallel.

Another embodiment provides a computer-program product for use in conjunction with the computer system. This computer-program product may include instructions corresponding to at least some of the preceding operations.

Another embodiment provides a method for monitoring execution of the user-configurable EDA flow. This method may include at least some of the preceding operations.

Another embodiment provides a graphical user interface in the flow-control environment, which is displayed on the display. This graphical user interface may be configured to monitor execution of the user-configurable EDA flow. Moreover, the execution-monitoring window may be configured to display a graphical representation of the sequence of blocks in the user-configurable EDA flow and, based at least in part on monitoring of execution of the user-configurable EDA flow, may be configured to display graphical execution status information during execution of the user-configurable EDA flow and errors, if any, which occur.

BRIEF DESCRIPTION OF THE FIGURES

Note that like reference numerals refer to corresponding parts throughout the drawings.

DETAILED DESCRIPTION

The following description is presented to enable any person skilled in the art to make and use the disclosure, and is provided in the context of a particular application and its requirements. Various modifications to the disclosed embodiments will be readily apparent to those skilled in the art, and the general principles defined herein may be applied to other embodiments and applications without departing from the spirit and scope of the present disclosure. Thus, the present disclosure is not intended to be limited to the embodiments shown, but is to be accorded the widest scope consistent with the principles and features disclosed herein.

Embodiments of a computer system, a method, a graphical user interface and a computer-program product (i.e., software) for use with the computer system are described. A chip designer may use these systems, devices, and/or techniques to configure and monitor the execution of tasks in a user-configurable electronic-design-automation (EDA) flow associated with a circuit or chip design. In particular, using an intuitive and interactive graphical user interface in EDA software, the chip designer can configure and initiate execution of the EDA flow. Then, during execution of EDA tasks in the EDA flow, an execution monitor in the graphical user interface may provide a graphical representation of real-time execution status information for the EDA tasks. Moreover, using the EDA software, the chip designer can debug the circuit or chip design if any errors or problems occur.

By providing real-time feedback on progress and any problems, these devices and techniques can improve: project visibility, productivity and/or predictability. For example, using these devices and techniques, chip designers can design circuits or chips that are manufacturing ready in a single-pass design cycle. Consequently, these devices and techniques may make it easier for chip designers to design circuits or chips, which can decrease the time and cost of circuit or chip design, thereby increasing customer satisfaction and retention.

Figure 1:
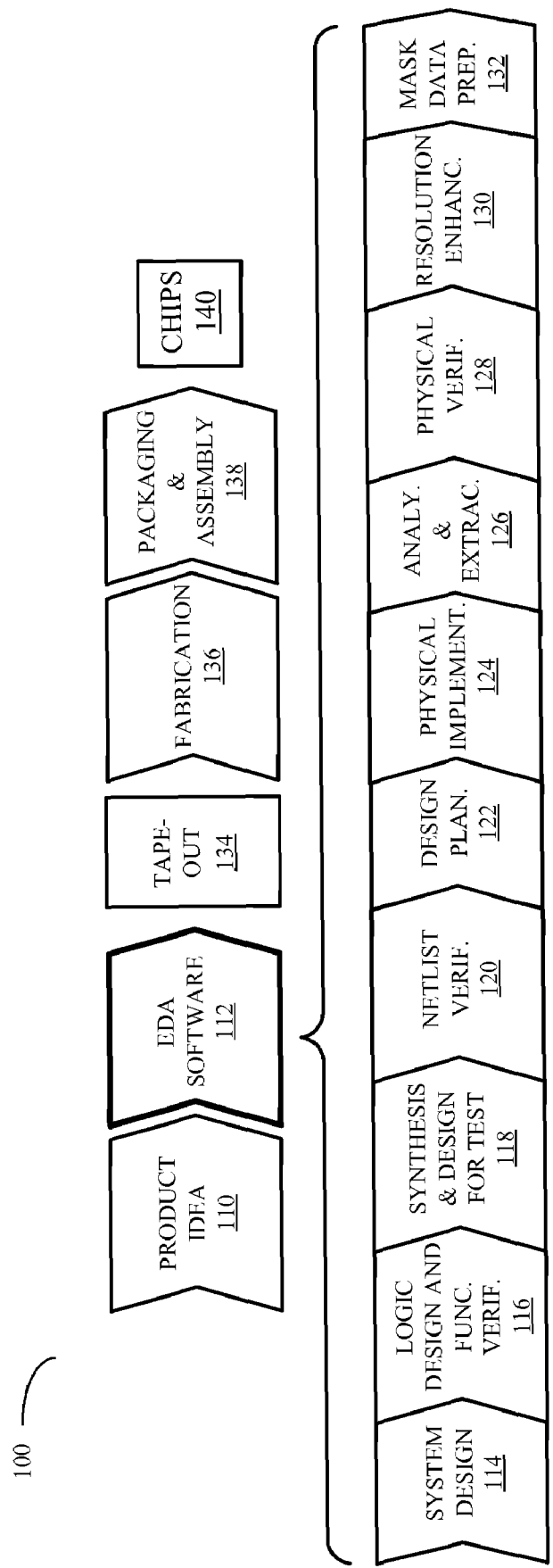
FIG. 1 is flowchart illustrating various operations in the design and fabrication of an integrated circuit in accordance with an embodiment of the present disclosure.

We now describe embodiments of design and fabrication of integrated circuits or chips. FIG. 1 is flowchart 100 illustrating the various operations in the design and fabrication of an integrated circuit. This process starts with the generation of a product idea (110), which is realized during a design process that uses electronic design automation (EDA) software (112). When the design is finalized, it can be taped-out (134). After tape-out, a semiconductor die is fabricated (136) and packaging and assembly processes (138) are performed, which ultimately result in finished chips (140).

Note that the design process that uses EDA software (112) includes operations 114-132, which are described below. This design flow description is for illustration purposes only. In particular, this description is not meant to limit the present disclosure. For example, an actual integrated circuit design may require a designer to perform the design operations in a different sequence than the sequence described herein.

During system design (114), designers describe the functionality to implement. They can also perform what-if planning to refine the functionality and to check costs. Note that hardware-software architecture partitioning can occur at this stage. Exemplary EDA software products from Synopsys, Inc. of Mountain View, Calif. that can be used at this stage include: Model Architect®, Saber, System Studio®, and Designware® products.

Then, during logic design and functional verification (116), VHDL or Verilog code for modules in the circuit is written and the design is checked for functional accuracy. More specifically, the design is checked to ensure that it produces the correct outputs. Exemplary EDA software products from Synopsys, Inc. of Mountain View, Calif. that can be used at this stage include: VCS®, Vera®, Designware®, Magellan®, Formality®, ESP® and Leda® products.

Next, during synthesis and design for test (118), VHDL/Verilog is translated to a netlist. This netlist can be optimized for the target technology. Additionally, tests can be designed and implemented to check the finished chips. Exemplary EDA software products from Synopsys, Inc. of Mountain View, Calif. that can be used at this stage include: Design Compiler®, Physical Compiler®, Test Compiler®, Power Compiler®, FPGA Compiler®, Tetramax®, and Designware® products.

Moreover, during netlist verification (120), the netlist is checked for compliance with timing constraints and for correspondence with the VHDL/Verilog source code. Exemplary EDA software products from Synopsys, Inc. of Mountain View, Calif. that can be used at this stage include: Formality®, Primetime®, and VCS® products.

Furthermore, during design planning (122), an overall floor plan for the chip is constructed and analyzed for timing and top-level routing. Exemplary EDA software products from Synopsys, Inc. of Mountain View, Calif. that can be used at this stage include: Astro® and IC Compiler® products.

Additionally, during physical implementation (124), the placement (positioning of circuit elements) and routing (connection of the same) occurs. Exemplary EDA software products from Synopsys, Inc. of Mountain View, Calif. that can be used at this stage include: the Astro® and IC Compiler® products.

Then, during analysis and extraction (126), the circuit function is verified at a transistor level, which permits refinement. Exemplary EDA software products from Synopsys, Inc. of Mountain View, Calif. that can be used at this stage include: Astrorail®, Primerail®, Primetime®, and Star RC/XT® products.

Next, during physical verification (128), the design is checked to ensure correctness for: manufacturing, electrical issues, lithographic issues, and circuitry. Exemplary EDA software products from Synopsys, Inc. of Mountain View, Calif. that can be used at this stage include the Hercules® product.

Moreover, during resolution enhancement (130), geometric manipulations of the layout are performed to improve manufacturability of the design. Exemplary EDA software products from Synopsys, Inc. of Mountain View, Calif. that can be used at this stage include: Proteus®, Proteus®AF, and PSMGED® products.

Additionally, during mask-data preparation (132), the 'tape-out' data for production of masks to produce finished chips is provided. Exemplary EDA software products from Synopsys, Inc. of Mountain View, Calif. that can be used at this stage include the CATS® family of products.

Embodiments of the present disclosure can be used during one or more of the above-described stages. Specifically, in some embodiments the present disclosure can be used in EDA software that includes operations between design (114) and resolution enhancement (130).

We now describe embodiments of a technique for monitoring execution of a user-configurable EDA flow. EDA software may provide interactive flow-control environment that includes EDA tools, utilities and automation which allow a user (such as a chip designer) to design a circuit or a chip, including: layout, node optimization, and EDA flows that include multiple EDA tasks or tool scripts. These EDA flows may include block-level flows and full-chip hierarchical flows, which act on a circuit or chip design (which is henceforth referred to as a circuit design). Using the interactive flow-control environment, the user can configure and monitor these user-configurable EDA flows in real time (i.e., as they execute).

To accelerate circuit development using the EDA software, the user may use a variety of preconfigured or predefined content, including EDA tool scripts with default technology settings and/or default flows associated with blocks in the circuit design. However, the EDA software also supports user-defined technology settings and block configurations (i.e., the EDA software is programmable).

In general, a particular design may be specified by a corresponding user-configurable EDA flow, which includes a sequence of blocks having associated block flows and sub-block or step flows. A given block in the sequence of blocks may include one or more sub-block flows, and a given sub-block in the sub-block flow may represent a sequence of EDA tasks that are performed on a circuit design.

In the discussion that follows, an EDA task is defined as an EDA tool script that performs a single or small number of related commands on a circuit design. For example, the EDA tasks may include: an elaborate script, a synthesis script, a clock route script, a design-implementation script, a design-optimization script, a design-analysis script, etc. In contrast with operating-system processes, these commands operate on a circuit design. Note that each EDA task may involve multiple operating-system processes.

Moreover, a step flow (or a sub-block flow) is defined as a collection or sequence of inter-coupled EDA tasks that operate on the circuit design. In general, step flows are grouped into functional areas such as: synthesis, floor planning, place and route, chip finishing, etc. Note that a step flow is always 'flat.'

Additionally, a block flow is defined as a collection or sequence of inter-coupled step flows that complete at least a portion of the circuit design. Note that block flows can be hierarchical flows (e.g., flows that have a treed structure with a root level and one or more dependent branches). Furthermore, many circuit designs are specified as a sequence of inter-coupled blocks (and their associated flows).

The EDA software can include foundry-ready technology, designs and libraries, such as EDA tool scripts and flow templates that are preconfigured based at least in part on the requirements associated with particular semiconductor manufacturers or manufacturing facilities, and which are already validated. In addition, the EDA software may provide preconfigured foundry-specific checklists and documentation to assist the user in prompt and successful tape-out of the circuit design.

In order to improve product visibility (and, thus, user productivity), the EDA software may also support the generation of on-demand management reports, including real-time queries during the execution of a user-configurable EDA flow. These reports may be user configured, and may allow the user to monitor performance metrics, such as: area utilization, clock speed, power consumption, and/or any errors that occur during execution of the user-configurable EDA flow.

Figure 2:
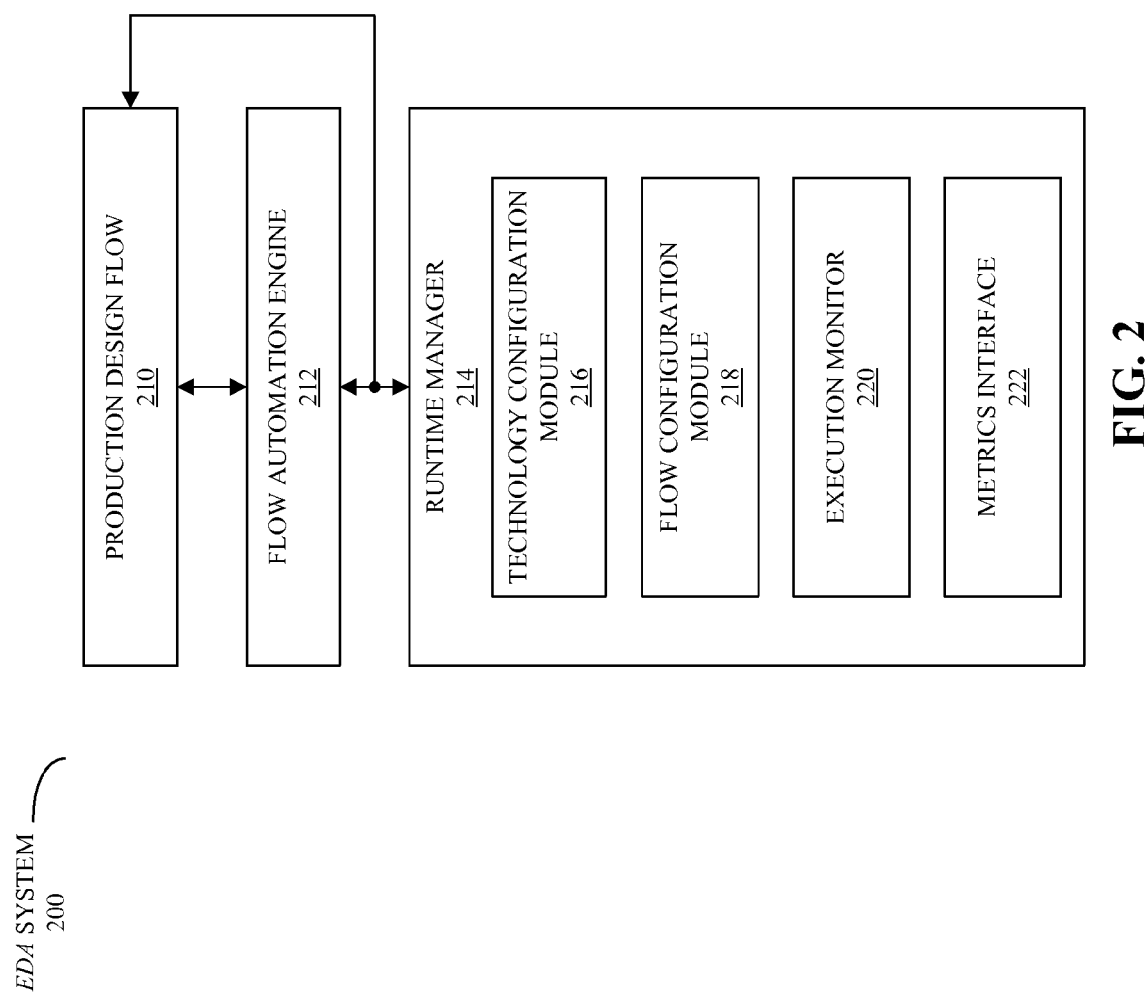
FIG. 2 is a block diagram illustrating an EDA system in accordance with an embodiment of the present disclosure.

FIG. 2 presents a block diagram illustrating an EDA system 200 that implements the EDA software. As described further below, this EDA system 200 may execute in an operating environment (e.g., in a computing environment provided by an operating system, such as Unix). Furthermore, EDA system 200 may be implemented using a variety of computing systems, such as in a client-server architecture via a network or as a stand-alone software application that is resident on and which executes on a computer or server.

EDA system 200 includes production design flow 210, which includes EDA tool scripts (as well as associated technology settings) that define an EDA design methodology that operates on the circuit design when the corresponding EDA flow is executed in the EDA software.

EDA system 200 also includes flow automation engine 212, which is configured to launch, execute and then close EDA tool scripts (i.e., to spawn EDA processes). Thus, flow automation engine 212 interfaces with the operating system in the computer system.

Furthermore, EDA system 200 includes a runtime manager 214, which has: a technology configuration module 216, a flow configuration module 218, an execution monitor 220 and/or a metrics interface 222. Using control icons in a flow-control environment provided by runtime manager 214 (such as the graphical user interface described further below with reference to FIG. 3) in conjunction with technology configuration module 216, the user can adjust or modify the technology settings of one or more EDA tool scripts in a given block. To assist the user, the technology configuration module 216 may guide this setup procedure by providing a set of possible variables in a pull-down menu in the flow-control environment. In addition, using control icons or a mouse in a flow-control environment in conjunction with flow configuration module 218, the user can define or rearrange blocks in the sequence of blocks in a given EDA flow (as described further below with reference to FIG. 5). When reading, writing or editing information associated with a given block, runtime manager 214 may interface directly with the production design flow 210 (as opposed to indirectly interfacing with production design flow 210 via flow automation engine 212).

When the user starts execution of the given EDA flow using an execute control icon in the flow-control environment, execution monitor 220 interfaces with flow automation engine 212 to monitor execution of one or more flows (such as one or more block flows or sub-block flows), as well as their associated EDA tasks, which may execute sequentially or in parallel. (In general, execution monitor 220 may be used to monitor distributed processes.) In particular, using knowledge of the EDA tasks, a sequence of blocks in the given EDA flow, and circuit-design data, execution monitor 220 may interface (back and forth) with flow automation engine 212 to monitor progress during execution of the given user-configurable EDA flow. Then, execution monitor 220 may present execution status information to the user, such as progress in completing EDA tasks in the given user-configurable EDA flow (such as the sequence of EDA tasks in a particular sub-block flow), as well as identifying any errors that occur. As described further below with reference to FIG. 5, this execution status information and/or error information may be presented using intuitive color-coded information (such as green, yellow and red) in a graphical representation of the sequence of blocks and/or EDA tasks in the given user-configurable EDA flow.

If an error or a problem occurs during execution of the given user-configurable EDA flow, the user may activate a stop icon in the flow-control environment. Then, the user may view detailed error information and/or may activate a debug icon in the flow-control environment to address the error before continuing to execute the given user-configurable EDA flow. In this way, EDA system 200 allows the user to fix problems 'during' execution of the given user-configurable EDA flow (as opposed to waiting until the entire flow has executed).

During or after execution of the given EDA flow, the user may use metrics interface 222 to generate on-demand management reports.

Figure 3:
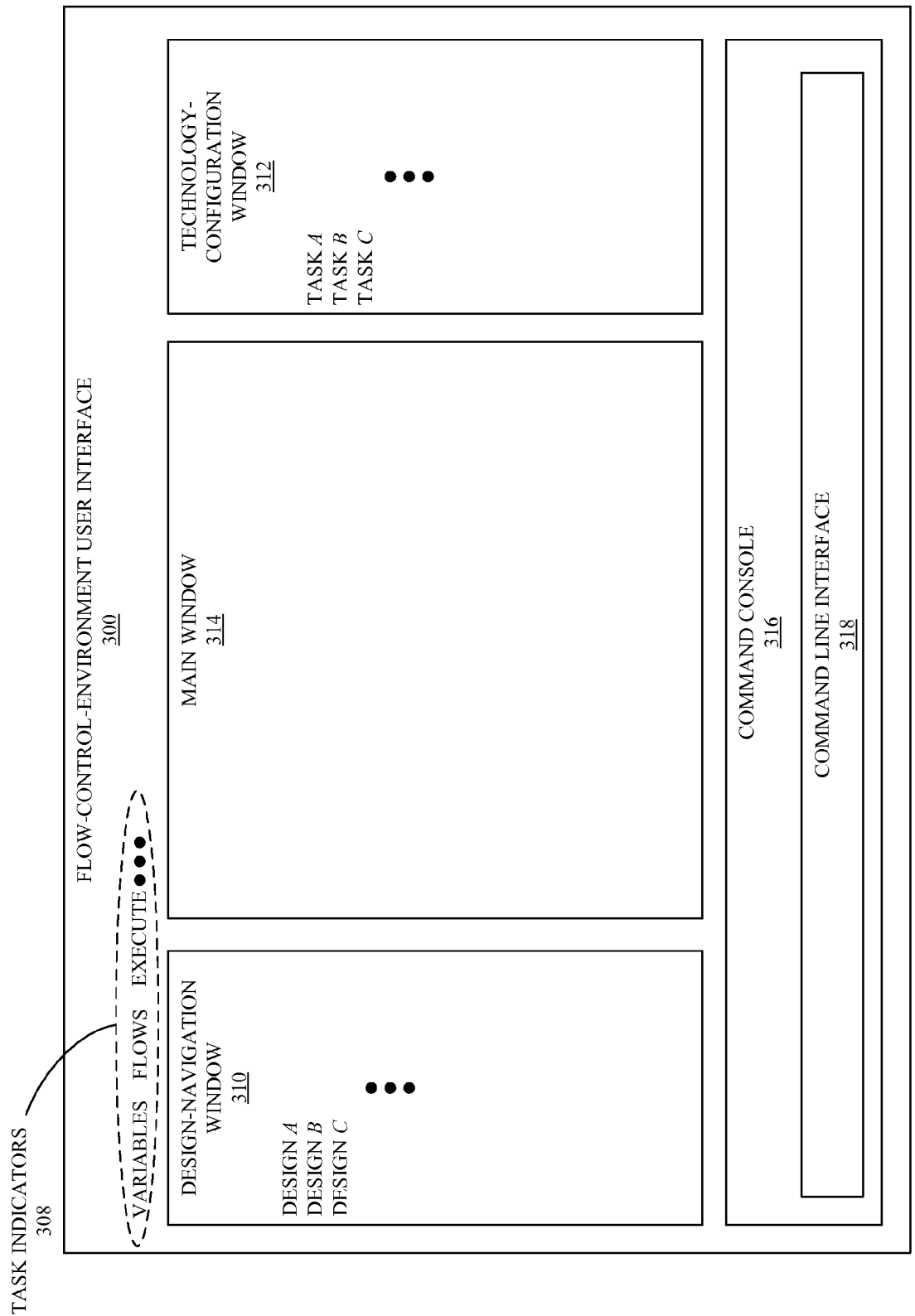
FIG. 3 is a block diagram illustrating a flow-control-environment user interface in accordance with an embodiment of the present disclosure.

FIG. 3 presents a block diagram illustrating a flow-control-environment user interface 300 provided by runtime manager 214 (FIG. 2). This user interface includes task indicators 308 for pull-down menus (which include control icons such as execute, stop, debug, etc.) In addition, flow-control-environment user interface 300 includes: a design-navigation window 310, a technology-configuration window 312, a main window 314 and/or a command console 316. As described previously, design-navigation window 310 can be used to select existing and/or define new blocks in one or more circuit designs, and technology-configuration window 312 can be used to select existing and/or define technology settings for tool scripts in block or sub-block flows. Command console 316 may display a scrolling list of commands associated with EDA tasks as they are executed. In some embodiments, command console 316 includes a command line interface 318, which allows users to manually execute particular commands.

In flow-control-environment user interface 300, main window 314 is multipurpose. Consequently, the information displayed in this window is determined by what the user is doing. For example, when the user selects a block in design-navigation window 310 (for example, by clicking on the block using a mouse or using one of task indicators 308), the corresponding configuration information may be displayed in main window 314 as a series of pull-down menus (including preselected default values or current user-defined values). Similarly, when the user selects a task in a task flow in technology-configuration window 312 (for example, by clicking on the task using a mouse or using one of task indicators 308), the corresponding technology-setting information may be displayed in main window 314 as a series of pull-down menus (including preselected default values or current user-defined values).

Figure 4:
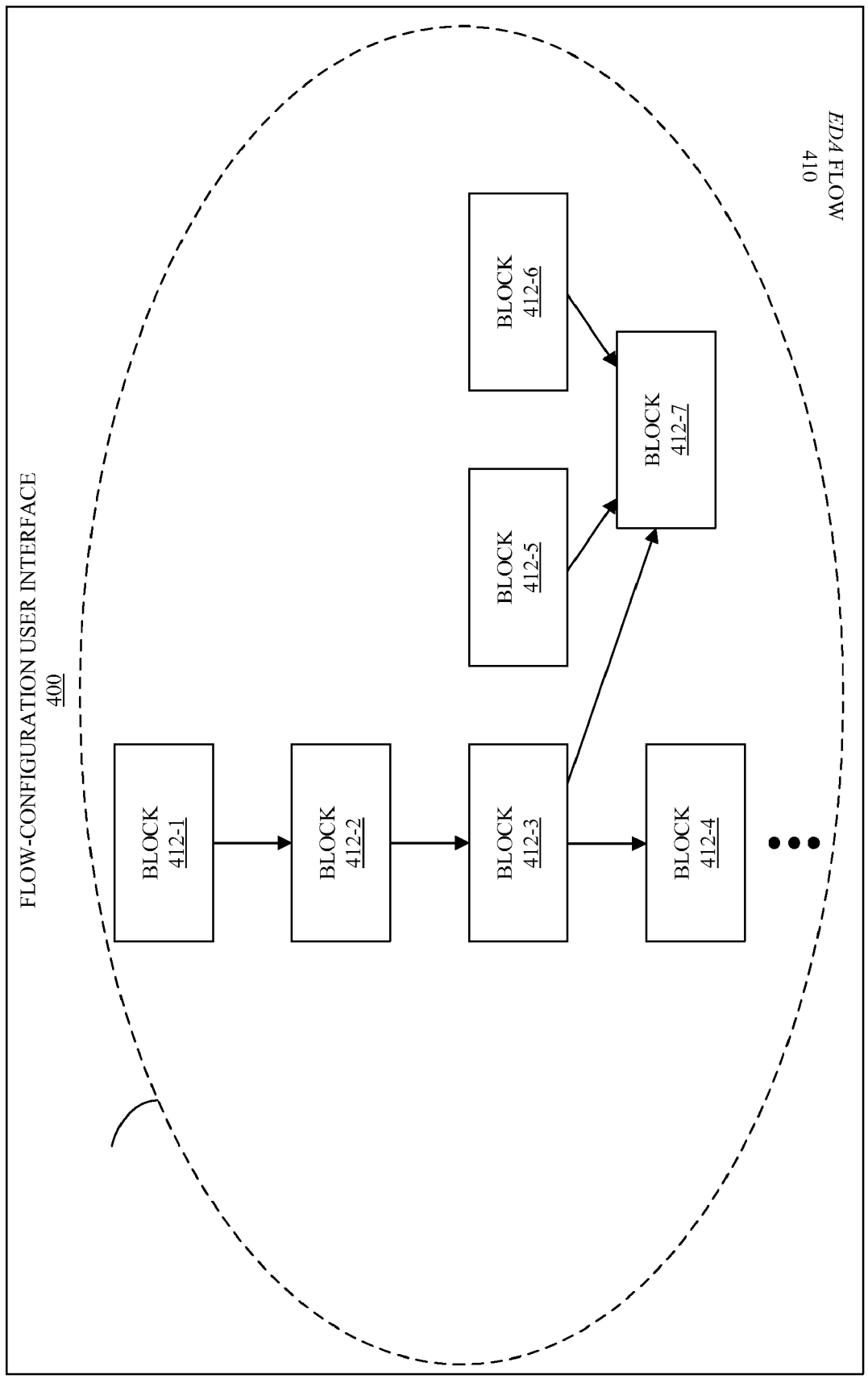
FIG. 4 is a block diagram illustrating a flow-configuration user interface in accordance with an embodiment of the present disclosure.

If the user activates the flow control icon (for example, by clicking on it using a mouse), main window 314 may display a flow configuration or EDA flow for a given circuit design. This is shown in FIG. 4, which presents a block diagram illustrating a flow-configuration user interface 400 that is displayed in main window 314 (FIG. 3). Using this flow-configuration user interface, the user may define or modify user-configurable EDA flow 410 (which graphically represents a top level in a hierarchical block flow for a sequence of blocks 412). In particular, the sequence of blocks in user-configurable EDA flow 410 may be adjusted by the user using drag-and-drop assembly of blocks 412. Moreover, the graphical representation of the sequence of blocks may be presented in a what-you-see-is-what-you-get (WYSIWYG) format. In this graphical representation, note that arrow icons may indicate sources and destinations of information during EDA flow 410.

In some embodiment, the sequence of blocks includes dummy EDA tasks (optional EDA tasks that provide additional analysis) and/or EDA tasks that are executed in parallel (such as those associated with blocks 412-3, 412-5 and 412-6). By executing at least portions of multiple blocks in parallel, the user can explore multiple EDA tasks, and can then select the best result for further processing.

Note that EDA tasks associated with a given block (such as block 412-1) can be viewed in a popup window by clicking on the given block using a mouse. Technology settings for one or more of these EDA tasks can then be modified. In addition, the user can call out sub-block flows from the top level in the sequence of blocks. These lower levels in the hierarchy are then displayed in main window 314 (FIG. 3), which allows the user to modify the sub-blocks, EDA tasks and/or sub-block inter-relationships as needed.

In an exemplary embodiment, block 412-1 includes a setup flow of EDA tasks; block 412-2 includes a setup-design flow of EDA tasks; block 412-3 includes a create-floor plan A flow of EDA tasks; and block 412-4 includes a power-insertion flow of EDA tasks. In addition, block 412-5 includes a create-floor plan B flow of EDA tasks, and block 412-6 includes a create-floor plan C flow of EDA tasks. These blocks are executed in parallel with block 412-3, and the results are analyzed in block 412-7, which includes a floor-plan-explore flow that selects the optimal floor plan for additional processing in EDA flow 410.

Figure 5:
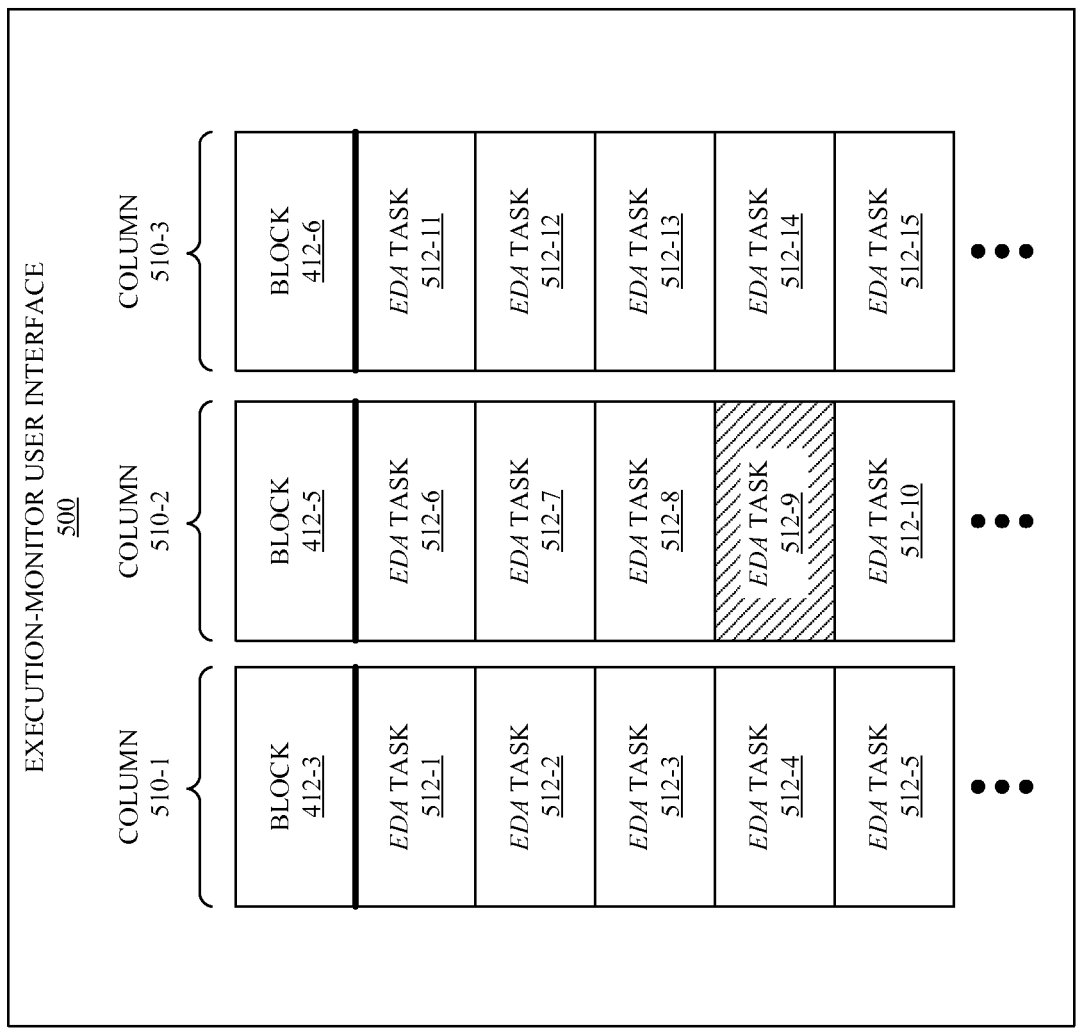
FIG. 5 is a block diagram illustrating an execution-monitor user interface in accordance with an embodiment of the present disclosure.

During execution of EDA flow 410 (FIG. 4), main window 314 (FIG. 3) may display real-time execution status information that is provided by execution monitor 220 (FIG. 2). This is shown in FIG. 5, which presents a block diagram illustrating an execution-monitor user interface 500 that is displayed in main window 314 (FIG. 3). This execution-monitor user interface includes one or more columns 510, each of which corresponds to sub-block or block flows that are executing in parallel. In each column, execution-monitor user interface 500 displays EDA tasks 512 and progress indicators. In an exemplary embodiment, the progress indicators include color coding the displayed EDA tasks 512. For example, the color coding may include: 'grey' for no status information; 'blue' for EDA tasks 512 that are waiting to execute; 'pink' for EDA tasks 512 that are executing; a 'black' background with 'red' lettering for EDA tasks 512 that are waiting to check (this is because there may be a delay in execution of operating-system processes associated with EDA tasks); a 'black' background with 'pink' lettering for EDA tasks 512 that are being checked; 'green' for EDA tasks 512 that have passed; 'yellow' for EDA tasks 512 that have a forced-pass status; and/or 'red' for EDA tasks 512 that have failed.

If an EDA task has failed and is colored red (as indicated by the hatched border on EDA task 512-9), the user may stop execution by activating a stop control icon in flow-control-environment user interface 300 (FIG. 3). Then, the user may click on a block in the graphical representation of the sequence of blocks using a mouse to view the associated error information. Alternatively or additionally, the user can click on a debug control icon using a mouse to launch a debug tool to fix the problem. After the problem has been fixed, the user can activate the execute control icon to continue execution of EDA flow 410 (FIG. 4).

This interactive user interface and the real-time execution status information allow the user to manage the given EDA flow, thereby increasing the user's productivity, with a commensurate decrease in the time and cost of circuit design.

Figure 6:
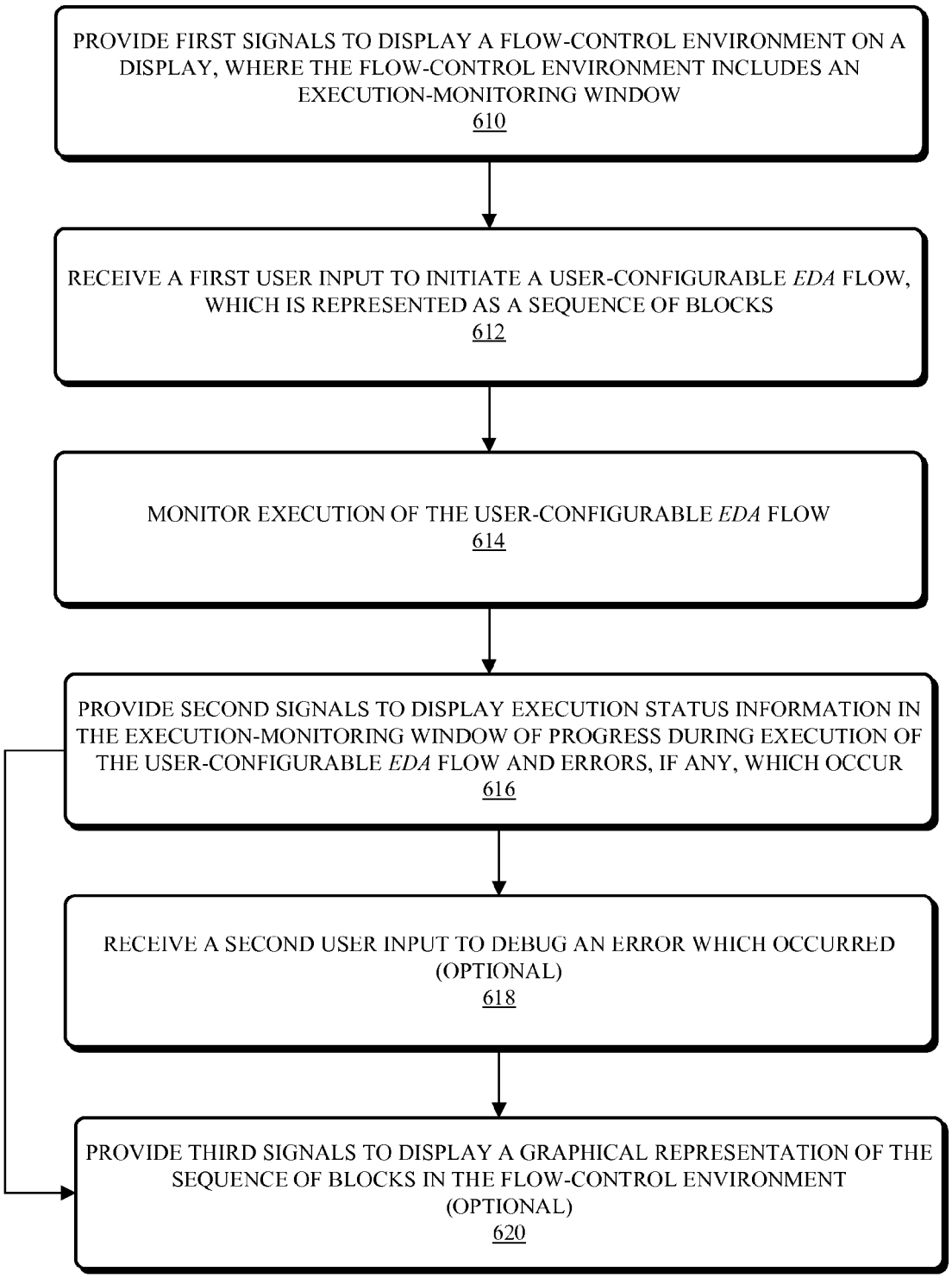
FIG. 6 is a flowchart illustrating a method for monitoring execution of a user-configurable EDA flow in the EDA system of FIG. 2 in accordance with an embodiment of the present disclosure.

FIG. 6 is a flowchart illustrating a method 600 for monitoring execution of the user-configurable EDA flow, which may be performed by a computer system. During operation, the computer system provides first signals to display a flow-control environment on a display (610), where the flow-control environment includes an execution-monitoring window. Moreover, the computer system receives a first user input to initiate the user-configurable EDA flow (612), which is represented as a sequence of blocks, and the computer system monitors execution of the user-configurable EDA flow (614). Then, the computer system provides second signals to display execution status information in the execution-monitoring window of progress during execution of the user-configurable EDA flow and errors, if any, which occur (616).

In some embodiments, the computer system optionally receives a second user input to debug an error which occurred (618). This error may be debugged during execution of the user-configurable EDA flow.

Furthermore, in some embodiments the computer system optionally provides third signals to display a graphical representation of the sequence of blocks in the flow-control environment (620). Note that progress and any errors during execution of the user-configurable EDA flow may be indicated in the graphical representation using color-coded information.

In some embodiments of method 600 there may be additional or fewer operations. Moreover, the order of the operations may be changed and/or two or more operations may be combined into a single operation.

Figure 7:
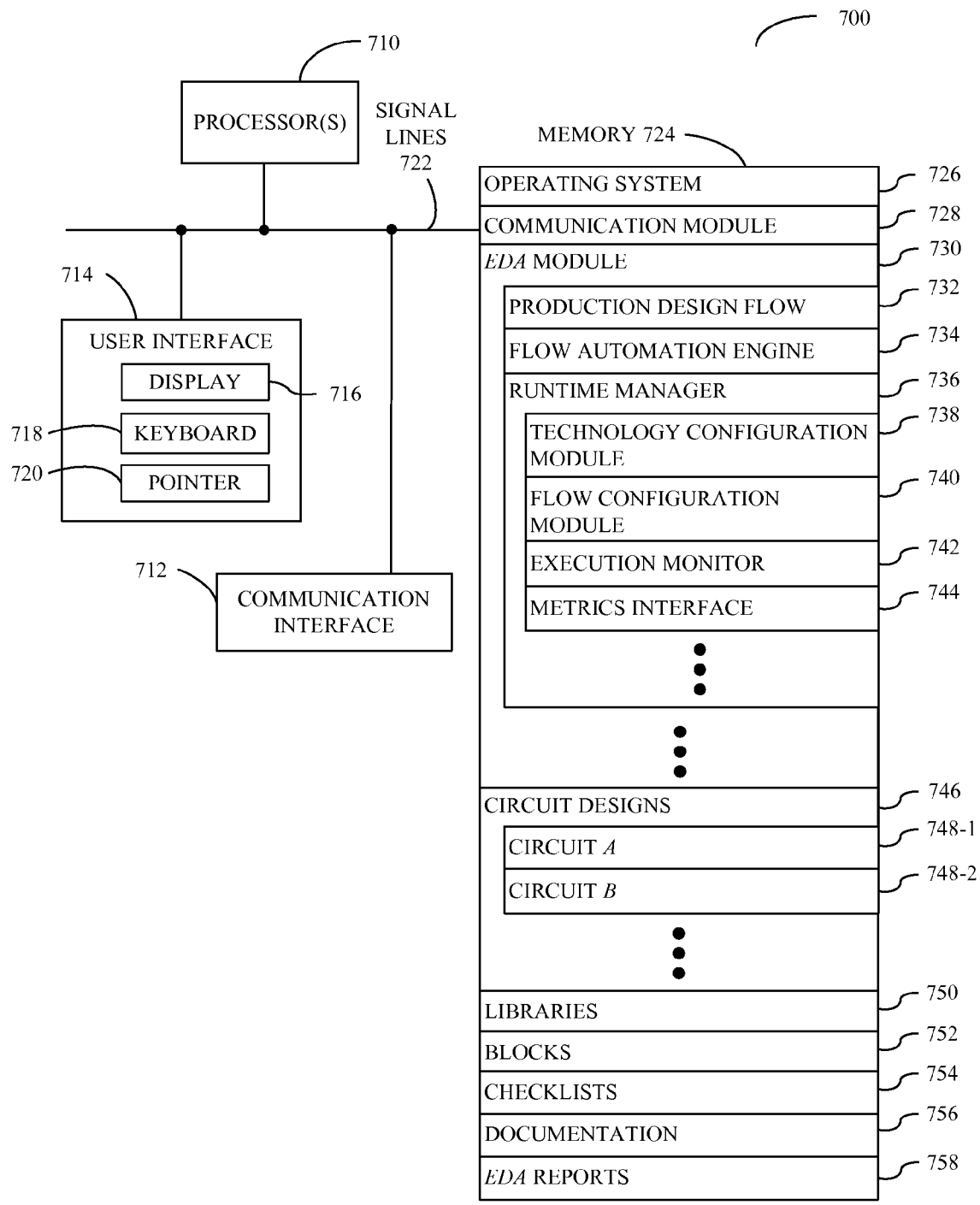
FIG. 7 is a block diagram illustrating a computer system that performs the method of FIG. 6 in accordance with an embodiment of the present disclosure.

We now describe embodiments of a computer system that performs method 600. FIG. 7 presents a block diagram illustrating a computer system 700. Computer system 700 includes: one or more processors 710, a communication interface 712, a user interface 714, and one or more signal lines 722 coupling these components together. Note that the one or more processing units 710 may support parallel processing and/or multi-threaded operation, the communication interface 712 may have a persistent communication connection, and the one or more signal lines 722 may constitute a communication bus. Moreover, the user interface 714 may include: a display 716, a keyboard 718, and/or a pointer 720, such as a mouse.

Memory 724 in computer system 700 may include volatile memory and/or non-volatile memory. More specifically, memory 724 may include: ROM, RAM, EPROM, EEPROM, flash, one or more smart cards, one or more magnetic disc storage devices, and/or one or more optical storage devices. Memory 724 may store an operating system 726 that includes procedures (or a set of instructions) for handling various basic system services for performing hardware-dependent tasks. Memory 724 may also store procedures (or a set of instructions) in a communication module 728. These communication procedures may be used for communicating with one or more computers and/or servers, including computers and/or servers that are remotely located with respect to computer system 700.

Memory 724 may also include multiple program modules (or sets of instructions), including EDA module 730 (or a set of instructions). Moreover, EDA module 730 may include: production design flow 732 (or a set of instructions), flow automation engine 734 (or a set of instructions), and/or runtime manager 736 (or a set of instructions). Additionally, runtime manager 736 may include: technology configuration module 738 (or a set of instructions), flow configuration module 740 (or a set of instructions), execution monitor 742 (or a set of instructions), and/or metrics interface 744 (or a set of instructions).

Using EDA module 730, a user may configure blocks for use in an EDA flow, which may include a sequence of blocks. For example, using technology configuration module 738, the user may select preconfigured technological settings for EDA tasks in sub-block flows associated with one or more blocks. Alternatively or additionally, the user may adjust the configuration of these blocks. During subsequent execution of the EDA flow, these modifications may be used by production design flow 732, which includes EDA tool scripts.

Then, using flow configuration module 740, the user may assemble blocks 752 to define a sequence of blocks (and, thus, the EDA flow) for a circuit design. Moreover, the user may save this design in circuit designs 746 (which may include multiple circuit designs, such as designs for circuit A 748-1 and circuit B 748-2). Alternatively or additionally, the user may select an existing circuit design in libraries 750.

Next, the user may initiate execution of the EDA flow for a given circuit design. During execution, flow automation engine 734 may interact with production design flow 732 and operating system 726 to initiate, monitor and close EDA tools scripts. In turn, execution monitor 742 may interact with flow automation engine 734 to monitor the execution of the blocks, flows and EDA tasks associated with the EDA flow, and to provide execution status information to the user. As discussed previously, this execution status information may be presented to the user in real time (during execution of the EDA flow) via an intuitive graphical representation. Furthermore, the user may address any errors or problems as they occur during execution of the EDA flow using runtime manager 736.

In addition, during execution of the EDA flow, the user may generate one or more EDA reports 758 using metrics interface 744. These reports may be preconfigured based on requirements associated with one or more foundries. More generally, the user may use foundry-specific checklists 754 and/or documentation 756 to accelerate project completion and to improve manufacturability of the circuit designs.

Instructions in the various modules in the memory 724 may be implemented in: a high-level procedural language, an object-oriented programming language, and/or in an assembly or machine language. Note that the programming language may be compiled or interpreted, e.g., configurable or configured, to be executed by the one or more processing units 710.

Computer system 700 may include a variety of devices, such as: a personal computer, a laptop computer, a server, a work station, a main-frame computer, and/or other device capable of manipulating computer-readable data.

Although computer system 700 is illustrated as having a number of discrete items, FIG. 7 is intended to be a functional description of the various features that may be present in computer system 700 rather than a structural schematic of the embodiments described herein. In practice, and as recognized by those of ordinary skill in the art, the functions of computer system 700 may be distributed over a large number of servers or computers, with various groups of the servers or computers performing particular subsets of the functions. Consequently, computer system 700 may be at one location or may be distributed across multiple locations, such as computing systems that communicate via a network (such as the Internet or an intranet).

In some embodiments, some or all of the functionality of computer system 700 may be implemented in one or more: application-specific integrated circuit (ASICs), field-programmable gate array (FPGAs), and/or one or more digital signal processors (DSPs). Thus, circuit analysis or simulations may be performed using an FPGA. Note that the functionality of computer system 700 may be implemented more in hardware and less in software, or less in hardware and more in software, as is known in the art.

Figure 8:
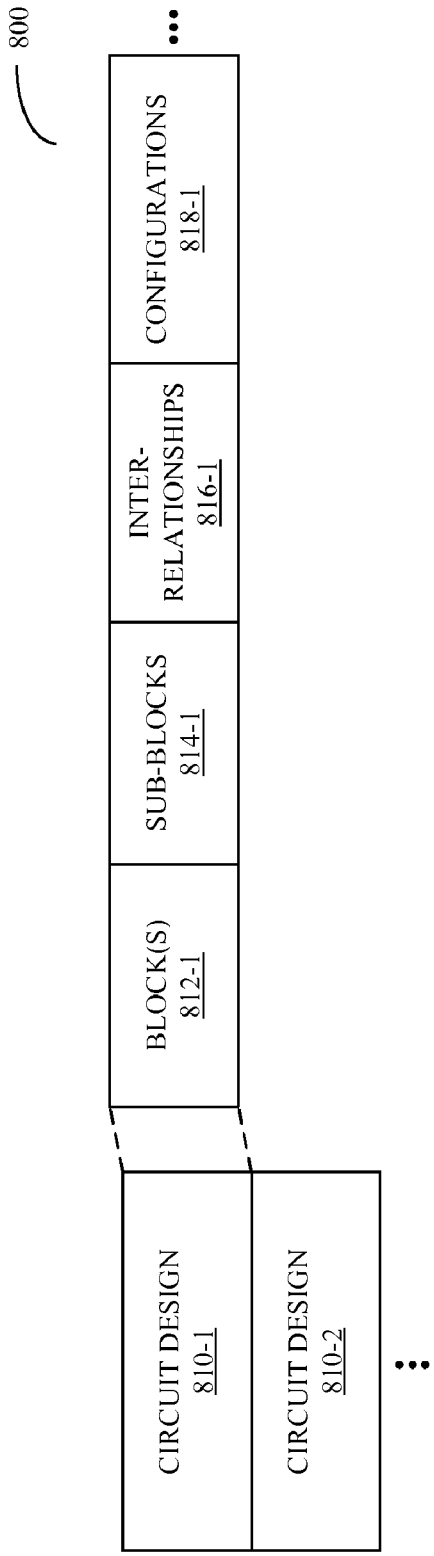
FIG. 8 is a block diagram illustrating a data structure in accordance with an embodiment of the present disclosure.

We now discuss embodiments of data structures that may be used in computer system 700. FIG. 8 presents a block diagram illustrating a data structure 800. This data structure may include tables of circuit-design 810 information. For example, circuit design 810-1 may include: one or more blocks 812-1 (and the associated flows), one or more sub-blocks 814-1 (and the associated sub flows), inter-relationships 816-1 between blocks 812-1 and sub-blocks 814-1, and/or configurations 818-1 for blocks 812-1 and sub-blocks 814-1.

Figure 9:
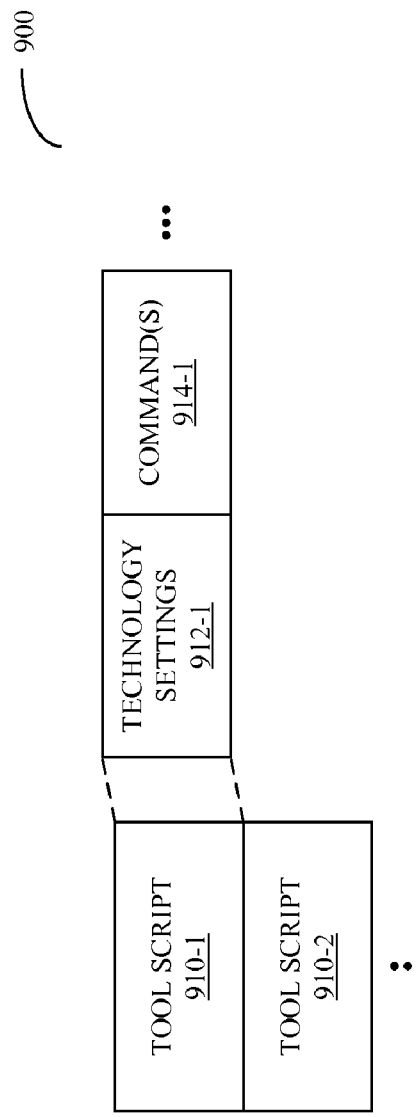
FIG. 9 is a block diagram illustrating a data structure in accordance with an embodiment of the present disclosure.

FIG. 9 presents a block diagram illustrating a data structure 900. This data structure may include tool scripts 910 that are performed on a circuit design in the flows associated with various blocks. For example, tool script 910-1 may include: technology settings 912-1 and/or one or more commands 914-1.

In some embodiments, EDA system 200 (FIG. 2), flow-control-environment user interface 300 (FIG. 3), flow-configuration user interface 400 (FIG. 4), execution-monitor user interface 500 (FIG. 5), computer system 700 (FIG. 7), data structure 800 (FIG. 8) and/or data structure 900 include fewer or additional components. Moreover, two or more components may be combined into a single component and/or a position of one or more components may be changed.

The foregoing descriptions of embodiments of the present disclosure have been presented for purposes of illustration and description only. They are not intended to be exhaustive or to limit the present disclosure to the forms disclosed. Accordingly, many modifications and variations will be apparent to practitioners skilled in the art. Additionally, the above disclosure is not intended to limit the present disclosure. The scope of the present disclosure is defined by the appended claims.

What is claimed is:

1. A method for monitoring execution of a user-configurable electronic design automation (EDA) flow, comprising:
    providing first signals to display an EDA flow-control environment on a display, wherein the flow-control environment includes an execution-monitoring window;
    initiating, based on a first user input, the user-configurable EDA flow, which is displayed as a top-level sequence of blocks, wherein a block in the sequence of blocks comprises a user-configurable collection of sub-block flows, wherein a sub-block in a sub-block flow represents a sequence of EDA tasks that are performed on the circuit design;
    receiving, from the user, modifications to one or more blocks or sub-blocks at any level of a hierarchy of blocks and sub-blocks;
    monitoring execution of the user-configurable EDA flow tasks, wherein the EDA flow tasks result in a realization of an integrated chip design product idea, and wherein the EDA flow tasks comprise logic design, functional verification, synthesis, top-level routing, and timing analysis; and
    displaying, based on a second user input, execution status information and progress in execution of the blocks and the sub-blocks at a desired level of the hierarchy of blocks and associated sub-blocks, wherein the displayed execution status information and progress in execution reflects the received modifications from the user.

2. The method of claim 1, further comprising receiving the second user input to debug an error that has occurred during execution of the user configurable EDA flow, and receiving a third user input to view detailed information on the error that occurred.

3. The method of claim 2, further comprising:
    receiving fourth user input to stop execution of the user-configurable EDA flow prior to the debugging; and
    receiving fifth user input to resume execution of the user-configurable EDA flow after the debugging.

4. The method of claim 1, wherein execution of the user-configurable EDA flow includes monitoring the execution of the sequence of EDA tasks; and
    wherein the execution status information includes execution status of the sequence of EDA tasks.

5. The method of claim 4, wherein at least some of the sequence of EDA tasks are predefined.

6. The method of claim 1, wherein the execution status information includes color-coded information.

7. The method of claim 1, wherein at least portions of the sequence of blocks are predefined.

8. The method of claim 1, further comprising providing third signals to display a graphical representation in the sequence of blocks in the flow-control environment.

9. The method of claim 8, wherein the graphical representation of the sequence of blocks is presented in a what-you-see-is-what-you-get format.

10. The method of claim 8, wherein the sequence of blocks is defined by drag-and-drop assembly of blocks.

11. The method of claim 8, wherein arrow icons between flows in the graphical representation indicate sources and destinations of information during the user-configurable EDA flow.

12. The method of claim 8, wherein progress and any errors during execution of the user-configurable EDA flow are indicated in the graphical representation using color-coded information.

13. The method of claim 1, wherein the sequence of blocks includes blocks that are executed in parallel.

14. A computer-program product for use in conjunction with a computer system, the computer-program product comprising a non-transitory computer-readable storage medium and a computer-program mechanism embedded therein for configuring the computer system to monitor execution of a user-configurable electronic design automation (EDA) flow, comprising:
    instructions for providing first signals to display an EDA flow-control environment on a display, wherein the flow-control environment includes an execution-monitoring window;
    instructions for initiating, based on a first user input, the user-configurable EDA flow, which is displayed as a top-level sequence of blocks, wherein a block in the sequence of blocks comprises a user-configurable collection of sub-block flows, wherein a sub-block in a sub-block flow represents a sequence of EDA tasks that are performed on the circuit design;
    instructions for receiving, from the user, modifications to one or more blocks or sub-blocks at any level of a hierarchy of blocks and sub-blocks;
    instructions for monitoring execution of the user-configurable EDA flow tasks, wherein the EDA flow tasks result in a realization of an integrated chip design product idea, and wherein the EDA flow tasks comprise logic design, functional verification, synthesis, top-level routing, and timing analysis; and
    instructions for displaying, based on a second user input, execution status information and progress in execution of the blocks and the sub-blocks at a desired level of the hierarchy of blocks and associated sub-blocks, wherein the displayed execution status information and progress in execution reflects the received modifications from the user.

15. The computer-program product of claim 14, further comprising instructions for receiving the second user input to debug an error that has occurred during execution of the user configurable EDA flow, and receiving a third user input to view detailed information on the error that occurred.

16. The computer-program product of claim 15, further comprising:
    receiving fourth user input to stop execution of the user-configurable EDA flow prior to the debugging; and
    receiving fifth user input to resume execution of the user-configurable EDA flow after the debugging.

17. The computer-program product of claim 14, wherein the execution status information includes color-coded information.

18. The computer-program product of claim 14, further comprising providing third signals to display a graphical representation in the sequence of blocks in the flow-control environment.

19. The computer-program product of claim 18, wherein arrow icons between flows in the graphical representation indicate sources and destinations of information during the user-configurable EDA flow.

20. The computer-program product of claim 18, wherein progress and any errors during execution of the user-configurable EDA flow are indicated in the graphical representation using color-coded information.

21. The computer-program product of claim 14, wherein the sequence of blocks includes blocks that are executed in parallel.

22. A computer system, comprising:

a processor;

memory;

a program module, wherein the program module is stored in the memory and configured to be executed by the processor to monitor execution of a user-configurable electronic design automation (EDA) flow, the program module including:

instructions for providing first signals to display an EDA flow-control environment on a display, wherein the flow-control environment includes an execution-monitoring window;

instructions for initiating, based on a first user input, the user-configurable EDA flow, which is displayed as a top-level sequence of blocks, wherein a block in the sequence of blocks comprises a user-configurable collection of sub-block flows, wherein a sub-block in a sub-block flow represents a sequence of EDA tasks that are performed on the circuit design;

instructions for receiving, from the user, modifications to one or more blocks or sub-blocks at any level of a hierarchy of blocks and sub-blocks;

instructions for monitoring execution of the user-configurable EDA flow tasks, wherein the EDA flow tasks result in a realization of an integrated chip design product idea, and wherein the EDA flow tasks comprise logic design, functional verification, synthesis, top-level routing, and timing analysis; and instructions for displaying, based on a second user input, execution status information and progress in execution of the blocks and the sub-blocks at a desired level of the hierarchy of blocks and associated sub-blocks, wherein the displayed execution status information and progress in execution reflects the received modifications from the use.

23. A non-transitory computer-readable storage medium storing instructions for a graphical user interface on a computer, the instructions comprising:

instructions for displaying the graphical user interface in a flow-control environment, wherein the graphical user interface is configured to monitor execution of a user-configurable electronic design automation (EDA) flow comprising a top-level sequence of blocks, wherein the user-configurable EDA flow comprises a user-configurable collection of sub-block flows, wherein a sub-block in a sub-block flow represents a sequence of EDA tasks that result in a realization of an integrated chip design product idea, and wherein the EDA flow tasks comprise logic design, functional verification, synthesis, top-level routing, and timing analysis; and instructions for displaying an execution-monitoring window in the graphical user interface, wherein the execution-monitoring window is configured to display a graphical representation of a sequence of blocks in the user-configurable EDA flow and, based at least in part on monitoring of execution of the user-configurable EDA flow, and to display graphical execution status information and progress during execution of the user-configurable EDA flow, wherein the displayed execution status information and progress in execution reflects modifications received from the user to one or more blocks or sub-blocks at any level of a hierarchy of blocks and sub-blocks.

\* \* \* \* \*